(12) United States Patent  (10) Patent No.: US 7,749,611 B2
Brenneman et al. (45) Date of Patent: *Jul. 6, 2010

(54) PEEL STRENGTH ENHANCEMENT OF COPPER LAMINATES

(75) Inventors: William L. Brenneman, Cheshire, CT (US); Andrew Vacco, Wallingford, CT (US); Szuchain F. Chen, Hamden, CT (US)

(73) Assignee: GBC Metals, L.L.C., East Alton, IL (US)

( * ) Notice: Subject to any disclaimer, the term of this patent is extended or adjusted under 35 U.S.C. 154(b) by 891 days.

This patent is subject to a terminal disclaimer.

(21) Appl. No.: 10/727,920

(22) Filed: Dec. 4, 2003

(65) Prior Publication Data

US 2004/0180225 A1    Sep. 16, 2004

Related U.S. Application Data

(60) Provisional application No. 60/431,013, filed on Dec. 5, 2002.

(51) Int. Cl.
 *B32B 15/08* (2006.01)
(52) U.S. Cl. .............. 428/612; 428/618; 428/621; 428/632; 428/633
(58) Field of Classification Search ........... 428/604, 428/621
See application file for complete search history.

(56) References Cited

U.S. PATENT DOCUMENTS

| 3,461,048 A | 8/1969 | Mahlstedt et al. ........... 204/41 |
| 3,518,169 A | 6/1970 | Oyama et al. ............... 204/35 |
| 4,387,006 A | 6/1983 | Kajiwara et al. ............ 204/32 |
| 4,468,293 A | 8/1984 | Polan et al. ................ 204/27 |
| 4,515,671 A | 5/1985 | Polan et al. ............... 204/228 |
| 4,619,871 A | 10/1986 | Takami .................... 428/607 |
| 5,022,968 A | 6/1991 | Lin et al. .................. 204/28 |
| 5,071,520 A * | 12/1991 | Lin et al. ................. 205/155 |
| 5,164,235 A | 11/1992 | Chao ..................... 427/436 |
| 5,234,573 A | 8/1993 | Takami .................... 205/155 |
| 5,338,619 A | 8/1994 | Fukuda et al. .............. 428/623 |

(Continued)

OTHER PUBLICATIONS

Rauch, Jr. et al., "A Study of Surface Chromium on Tinplate", *Journal of the Electrochemical Society*, vol. 120, No. 6, Jun. 1973, pp. 735-738.
Becker, "Surface Chromium on Chromate Treated Tin Plate", *Journal of the Electrochemical Scoiety*, vol. 117, No. 9, Sep. 1970, pp. 1211-1215.
Britton, "Electrochemical Assessment of Chromium in Passivation Films on Tinplate", *British Journal of Corrosion*, vol. 1, Nov. 1965, pp. 91-97.

(Continued)

*Primary Examiner*—Cathy Lam
(74) *Attorney, Agent, or Firm*—Harness, Dickey & Pierce, P.L.C.

(57) ABSTRACT

In one aspect, a copper foil for lamination to a dielectric substrate includes a layer deposited on a surface of the copper foil. The layer is formed from chromium and zinc ions or oxides and is treated with an aqueous solution containing at least 0.5% silane. In another aspect, a peel strength enhancement coating is disposed between a copper foil laminate and a dielectric substrate. The peel strength enhancement coating comprises a metal and metal oxide mixture containing a metal selected from groups 5B, 6B, and 7B of the periodic table of the elements. The effective thickness of the peel strength enhancement coating is that thickness capable of providing less than or equal to 10% loss of peel strength, when measured in accordance with IPC-TM-650 Method 2.4.8.5 using a ⅛ inch wide test specimen, after being immersed in 4N HCl at about 60° C. for 6 hours.

10 Claims, 4 Drawing Sheets

U.S. PATENT DOCUMENTS

| | | | |
|---|---|---|---|
| 5,366,814 A * | 11/1994 | Yamanishi et al. | 428/607 |
| 5,389,446 A | 2/1995 | Yamanishi et al. | 428/472 |
| 5,534,128 A | 7/1996 | Aso et al. | 205/176 |
| 5,800,930 A | 9/1998 | Chen et al. | 428/607 |
| 5,885,436 A | 3/1999 | Ameen et al. | 205/194 |
| 6,132,589 A | 10/2000 | Ameen et al. | 205/177 |
| 6,346,335 B1 * | 2/2002 | Chen et al. | 428/629 |
| 6,426,146 B1 | 7/2002 | Ameen et al. | 428/413 |
| 6,447,929 B1 * | 9/2002 | Wang et al. | 428/604 |

OTHER PUBLICATIONS

Institute for Interconnecting and Packaging Electronic Circuits, IPC-TM-650—Test Methods Manual.

"Printed Circuit Handbook", McGraw-Hill, $3^{rd}$ Ed., 1997, pp. 7-6 through 7-9; pp. 7.16 through 7.17; and pp. 35.8 through 35.13.

* cited by examiner

PEEL STRENGTH ENHANCEMENT OF COPPER LAMINATES

CROSS REFERENCE TO RELATED APPLICATION

This application claims the benefit of U.S. Provisional Patent Application No. 60/431,013, filed on Dec. 5, 2002, which is incorporated by reference herein in its entirety.

BACKGROUND OF THE INVENTION

1. Field of the Invention

This invention relates to the manufacture of printed circuit boards having a copper foil layer laminated to a dielectric substrate, and more particularly to a treatment to increase the adhesion of the copper foil layer to the dielectric substrate.

2. Description of the Related Art

Copper and copper base alloy foils are widely used in the printed circuit board industry. The foil is produced to a thickness of under 0.008 inches and more generally to a thickness in the range of from about 0.0002 inches (known in the art as ⅛ ounce foil). The foil is produced by one of two means. "Wrought" foil is produced by mechanically reducing the thickness of a copper or copper alloy strip by a process such as rolling. "Electrodeposited" foil is produced by electrolytically depositing copper ions on a rotating cathode drum and then peeling the deposited strip from the cathode.

The copper foil is bonded to a dielectric substrate forming a printed circuit board using a lamination process. The dielectric substrate is typically a fiberglass reinforced epoxy such as FR-4 (a fire retardant epoxy) or a polyimide such as Kapton® manufactured by DuPont. The lamination process includes bonding the copper foil layer to the dielectric substrate through the use of heat and pressure. A pressure of about 300 pounds per square inch (psi), at a temperature at about 175° C. for a time of up to 30 minutes will provide suitable adhesion between the layers.

To maximize adhesion, it is often desirable to roughen the surface of the foil that contacts the dielectric substrate prior to bonding. While there are a variety of techniques available to roughen or treat the foil, one exemplary technique involves the formation of a plurality of copper or copper oxide dendrites on the foil surface. U.S. Pat. Nos. 4,468,293 and 4,515,671, both to Polan et al. disclose this treatment. This treatment is referred as the CopperBond® treatment. CopperBond is a trademark of Olin Corporation of Norwalk, Conn. Another electrolytic surface roughening treatment is the deposition of copper/nickel nodules onto the surface of the foil that contacts the dielectric substrate, as disclosed in U.S. Pat. No. 5,800,930 to Chen et al. In some instances, at least one side of the foil, particularly the roughened side bearing the dendrites, may have an electrodeposited coating of zinc or brass applied thereto. This coating has been found to enhance the bond strength of the foil with the dielectric substrate.

While the use of roughened surfaces on the copper foil is effective to promote adhesion with the dielectric substrate, the degree of surface roughening is often restricted by the electrical performance requirements of the copper foil for high frequency applications. Problematically, decreasing the surface roughness to meet these electrical performance requirements compromises the adhesion (peel strength) between the copper foil and the dielectric substrate.

Another problem facing printed circuit board manufacturers using either electrolytic or wrought copper foils is the relative reactivity of the copper. As a result, copper readily stains and tarnishes. The stains and tarnish are aesthetically unpleasant and may be a source of problems during the manufacture of the printed circuit board. For example, staining of copper foil prior to lamination can affect both the bond strength between the foil and the dielectric substrate and the etching characteristics of the resultant laminate. The tarnish resistance of a copper foil may be enhanced by applying a thin (can be on the atomic scale) coating that contains co-deposited ions of zinc and chromium. This treatment, referred to as the P2 treatment, is disclosed in U.S. Pat. No. 5,022,968 to Lin et al.

The U.S. Pat. Nos. 4,515,671; 5,800,930 and 5,022,968 patents are incorporated by reference in their entireties herein.

BRIEF SUMMARY OF THE INVENTION

In one aspect of the invention, a peel strength enhancement coating is deposited on a surface of a copper foil, which may be laminated to a dielectric substrate. The peel strength enhancement coating consists essentially of a metal and metal oxide mixture, the metal and metal oxide mixture being formed from one or more of: vanadium, niobium, tantalum, chromium, molybdenum, tungsten, manganese, technetium, and rhenium. Preferably, the metal oxide is selected from one of chromate, tungstate, and molybdate. The surface of the copper foil may be smooth, and the peel strength enhancement coating may have a thickness of between about 20 to about 200 angstroms. Silane may be deposited on the peel strength enhancement coating prior to lamination to the dielectric substrate.

In another aspect of the invention, an article comprises a copper foil having a smooth surface laminated to a dielectric substrate. A peel strength enhancement coating is disposed between the copper foil and the dielectric substrate, and the copper foil exhibits less than or equal to 10% loss of peel strength when measured in accordance with IPC-TM-650 Method 2.4.8.5 using a ⅛ inch test specimen after being immersed in 4N HCl at 60° C. for 6 hours. The peel strength enhancement coating may also exhibit less than or equal to 10% edge undercut after the immersion in 4N HCl at 60° C. for 6 hours.

In another aspect of the invention, a method for increasing the peel strength of a copper foil laminated to a dielectric substrate comprises: prior to lamination, immersing the copper foil in an aqueous electrolytic solution containing oxyanions formed from one or more of: vanadium, niobium, tantalum, chromium, molybdenum, tungsten, manganese, technetium, and rhenium. Preferably, the metal is selected from one of chromium, molybdenum, and tungsten. The aqueous solution may be an electrolyte solution in an electrolytic cell, and the method further comprises: passing current through the copper foil and the electrolyte solution such that a coating having a thickness of between about 20 to about 200 angstroms is deposited on the copper foil. The method may further comprise immersing the copper foil in silane after depositing the coating on the copper foil.

In another aspect of the invention, a copper foil for lamination to a dielectric substrate comprises a layer deposited on a surface of the copper foil. The layer is formed from chromium and zinc ions or oxides and is treated with an aqueous solution containing at least 0.5% silane. The surface of the copper foil may be smooth, and the thickness of the layer may be from about 10 angstroms to about 100 angstroms.

In another aspect of the invention, a method for increasing the peel strength of a copper foil laminated to a dielectric substrate comprises: prior to lamination, co-depositing a mixture of chromium and zinc ions or oxides on surfaces of the copper or copper base alloy foil; subsequent to the co-deposition step, immersing the copper foil for at least one second in an aqueous solution containing at least 0.5% silane in deionized water; and drying the copper foil prior to lamination. The aqueous solution may be at a temperature of between about 15° C. to about 30° C. Co-depositing the mixture of chromium and zinc ions or oxides may include: providing an electrolytic cell containing an anode disposed in an electrolyte solution containing chromium and zinc ions; providing the copper foil as a cathode; and electrolytically depositing the chromium and zinc ions on the copper foil. The thickness of a layer formed from the chromium and zinc ions or oxides may be from about 10 angstroms to about 100 angstroms.

In one embodiment, the electrolyte solution is a basic solution containing hydroxide ions from about 0.07 g/l to about 7 g/l zinc ions, and from about 0.1 g/l to about 100 g/l of a water soluble hexavalent chromium salt wherein the concentration of either the zinc ions or the chromium (VI) ions or both is less than 1.0. In this embodiment, the co-deposition step includes: immersing the copper foil in the electrolyte solution; and passing current through the copper foil and the electrolyte solution such that a current density of from about 1 milliamp per square centimeter to about 1 amp per square centimeter is provided. The electrolyte solution may consist essentially of from about 10 to about 35 g/l NaOH, from about 0.2 to about 1.5 g/l ZnO, and from about 0.2 to about 2 g/l $Na_2Cr_2O_7.2H_2O$.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

The invention will be more fully understood from the following detailed description taken in conjunction with the accompanying drawings wherein like elements are numbered alike, and in which.

DETAILED DESCRIPTION

Two surface treatments are described herein that generate high adhesion between copper foil and a dielectric substrate, even where smooth copper foil is used. The invention is equally applicable to copper or copper-base alloy foils, where "base" means that the alloy contains at least 50%, by weight, of copper. As used herein, the term "copper foil" includes copper foil and copper-base alloy foil. Also, while the invention is particularly useful for use with a smooth copper foil, the invention could be applied to copper foils having any surface finish. The term "smooth", as used herein means a low profile surface, e.g., less than 1 μm Rz, where Rz is the average of five peak to valley distance measurements as measured using a surface profilometer.

Surface Treatment 1

Figure 1:
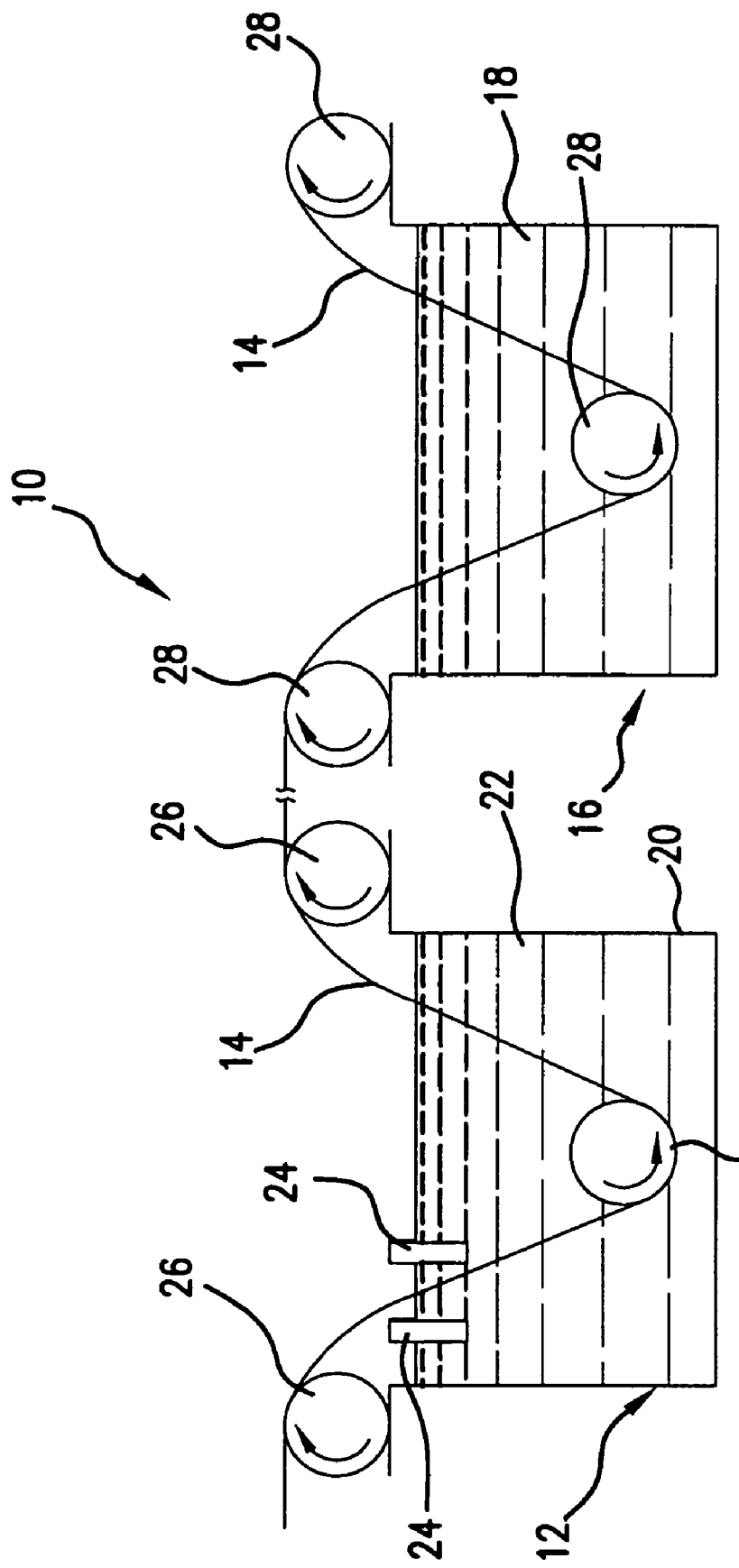
FIG. 1 illustrates an electrolytic cell system for peel strength enhancement of a copper laminate according to one embodiment of the present invention.

FIG. 1 illustrates a system 10 for peel strength enhancement of a copper laminate according to a first aspect of the present invention. The system 10 includes an electrolytic cell 12 for co-depositing a mixture of chromium and zinc metals or oxides on surfaces of a copper foil 14 using what is referred to herein as a P2 treatment, and a silane solution tank 16 wherein the coated copper foil 14 is immersed in an aqueous solution 18 containing silane. After leaving the silane solution tank 16, the copper foil 14 may be rinsed using deionized (DI) water and then dried before it is laminated to a dielectric substrate.

The electrolytic cell 12 includes a tank 20 containing an electrolytic solution 22, and anodes 24 between which the strip of copper foil 14 passes. The silane solution tank 16 contains the aqueous solution 18 containing silane. Guide rolls 26 and 28 may be used to control the travel of the strip of copper foil 14 through the electrolytic cell 12 and the silane solution tank 16, respectively. The guide rolls 26 and 28 are manufactured from any material that does not react with electrolyte solution 22. Preferably, at least one of the guide rolls 26 is formed from an electrically conductive material, such as stainless steel, so that a current may be impressed in the strip of copper foil 14 as detailed below. Guide rolls 26 rotate at a controlled speed so that the copper foil 14 is positioned between anodes 24 for a required time as discussed below. Guide rolls 28 rotate at a controlled speed so that the copper foil 14 is immersed in the aqueous solution 18 for a required time as discussed below.

In the electrolytic cell 12, a power source (not shown) is provided so that a direct electric current may pass from the anodes 24 to the strip of copper foil (cathode) 14 by means of the electrolytic solution 22. In this way, an anti-tarnish coating with the desired composition and thickness is deposited on the foil strip 14.

The electrolytic solution 22 is an aqueous solution that consists essentially of a hydroxide source, zinc ion source and a water soluble hexavalent chromium. The hydroxide source is preferably sodium hydroxide or potassium hydroxide, and most preferably, sodium hydroxide (NaOH). The hexavalent chromium source may be any water soluble hexavalent chromium compound such as $Na_2Cr_2O_7.2H_2O$.

In its broadest compositional range, the electrolyte solution 22 consists essentially of from about 5 to about 100 grams per liter (g/l) of the hydroxide, from 0.07 up to about 7 g/l of zinc ions supplied in the form of a water soluble zinc compound such as ZnO, and from 0.01 to about 100 g/l of a water soluble hexavalent chromium salt. Provided, however, that at least one of the zinc ion or chromium (VI) ion concentrations is less than 1.0 g/l. In a preferred embodiment, the electrolyte contains from about 10 to about 40 g/l NaOH, from about 0.16 to about 2 g/l zinc ions, most preferably be in the form of 0.2 to about 1.6 g/l Zn ions and from about 0.08 to about 30 g/l Cr(VI) ions most preferably be in the form of from about 0.2 to about 0.9 g/l Cr(VI) ions.

With each of the electrolyte solutions 22 described herein above, it is believed that an effective concentration of a surfactant such as lauryl sulfate will provide a more uniform surface.

The pH of the electrolyte solution 22 is maintained as basic. A pH in the range of from about 12 to 14 is preferred. The electrolyte solution 22 readily operates at all temperatures from room temperature up to about 100° C. For maximum deposition rates, it is preferred to maintain the electrolyte solution 22 temperature in the range of about 35° C. to about 65° C.

The electrolyte solution 22 operates well in a wide range of current densities. Successful coatings may be applied with a current density ranging from 1 milliamp per square centimeter (mA/cm$^2$) up to about 1 amp per square centimeter. A more preferred current density is from about 3 mA/cm$^2$ to about 100 mA/cm$^2$. The actual current density employed is dependent on the time the foil strip 14 is exposed to the current. That is, the time the copper foil strip 14 is between the anodes 24 and immersed in electrolyte solution 22. Typically, this dwell time is from about 10 to about 25 seconds. During this dwell, an effective thickness of the anti-tarnish coating compound is deposited. The effective thickness is that thickness capable of inhibiting copper tarnish at elevated temperatures of up to about 190° C. in air for about 30 minutes. The anti-tarnish coating should further be sufficiently thin to be easily removable with a 4% HCl etch solution or preferably a 5 wt % H$_2$SO$_4$ etch solution. It is believed that an effective coating thickness is from less than 100 angstroms to about 0.1 microns. Successful results have been obtained with coating thicknesses as low as 40 angstrom and coating thicknesses of from about 10 angstroms to about 100 angstroms are preferred. The coating layer is sufficiently thin to appear transparent or impart a slight gray tinge to the copper foil 14.

The coated strip of copper foil 14 exits the electrolytic cell 10 and is directed by rollers 28 through the aqueous solution 18 in the silane solution tank 16. The aqueous solution 18 preferably consists of at least 0.05% silane in DI (deionized) water at a temperature of between about 15° C. to about 30° C., and more preferably between about 20° C. to about 25° C. The copper foil 14 is preferably immersed in the aqueous solution 18 for one second or more.

The strip of copper foil 14 exits the silane solution tank 16, and any excess electrolyte solution 22 and aqueous solution 18 may be rinsed from the surfaces of the copper foil 14. The rinse solution may comprise deionized water. More preferably, a small quantity of a caustic is added to the deionized water rinse solution. The concentration of caustic is quite low, under 1 percent. Preferably the caustic concentration is from about 50 to about 150 parts per million. The caustic is selected to be the hydroxide of an alkali metal or the hydroxide of an alkaline earth metal selected from the group consisting of sodium hydroxide, calcium hydroxide, potassium hydroxide and ammonium hydroxide. Most preferred is calcium hydroxide.

After rinsing, the strip of copper foil 14 may be dried by forced air. The air may be cool (e.g., at room temperature) or heated. Heated forced air is preferred since accelerated drying minimizes spotting of the copper foil 14.

After drying, the copper foil 14 may then be bonded to a dielectric substrate for forming a printed circuit board or the like using any known lamination process. The dielectric substrate may include, for example, a fiberglass reinforced epoxy such as FR-4 (a fire retardant, glass filled epoxy) or a polyimide such as Kapton manufactured by DuPont. The lamination process may include bonding the copper foil layer to the dielectric substrate through the use of heat and pressure. For example, a pressure of about 300 psi, at a temperature at about 175° C. for a time of up to 30 minutes will provide suitable adhesion between the layers.

Surface Treatment 2

Figure 2:
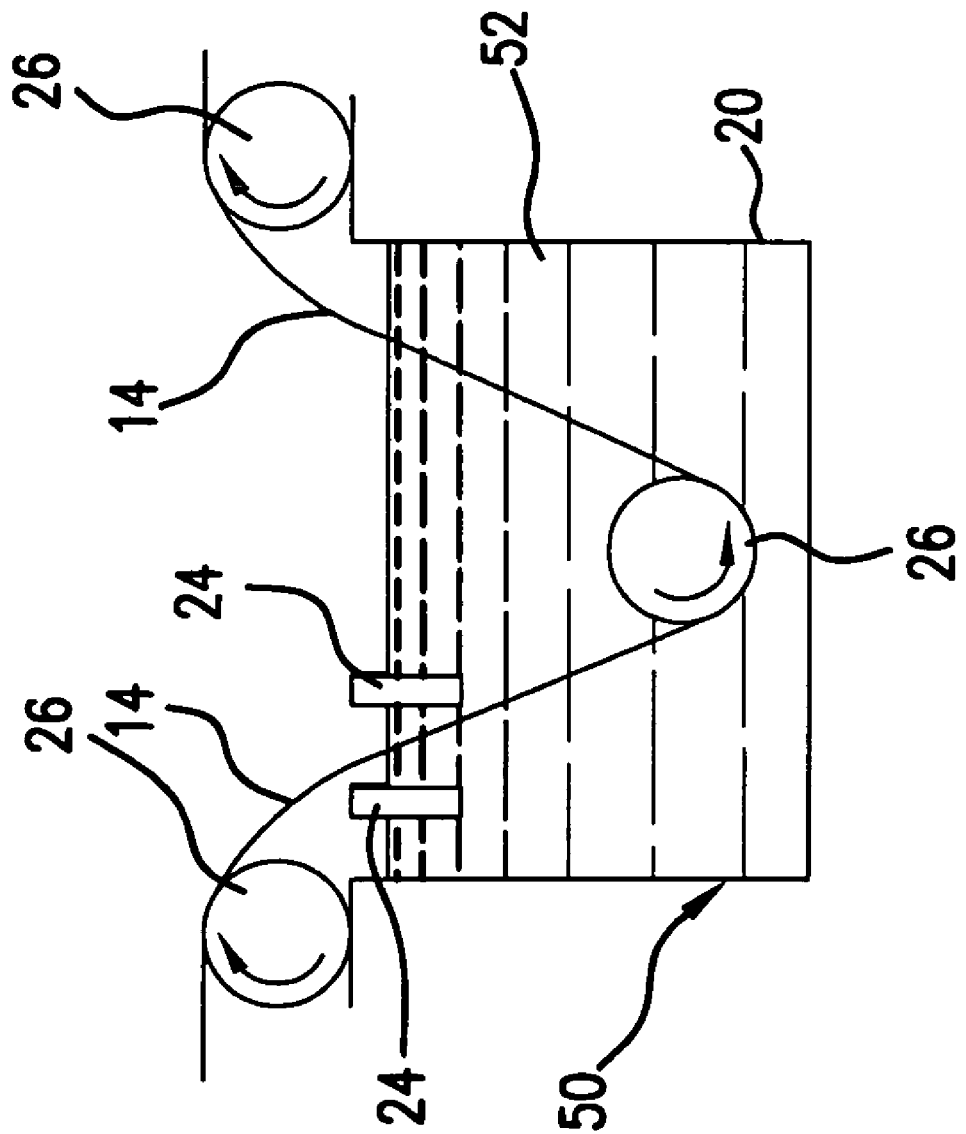
FIG. 2 illustrates an electrolytic cell system for peel strength enhancement of a copper laminate according to another embodiment of the present invention.

Referring now to FIG. 2, an electrolytic cell 50 for electrodepositing a peel strength enhancement coating on a copper foil, according to a second aspect of the present invention, is shown. The electrolytic cell 50 includes a tank 20 containing an aqueous electrolytic solution 52, and anodes 24 between which the strip of copper foil 14 passes. Guide rolls 26 may be used to control the travel of the strip of copper foil 14 through the electrolytic cell 50. The guide rolls 26 are manufactured from any material that does not react with electrolyte solution 52. Preferably, at least one of the guide rolls 26 is formed from an electrically conductive material, such as stainless steel, so that a current may be impressed in the strip of copper foil 14 as detailed below. Guide rolls 26 rotate at a controlled speed so that the copper foil 14 is positioned between anodes 24 for a required time as discussed below.

In the electrolytic cell 50, a power source (not shown) is provided so that an electric current may pass from the anodes 24 to the strip of copper foil (cathode) 14 by means of the electrolytic solution 52. In this way, a peel strength enhancement coating with the desired composition and thickness is deposited on the foil strip 14.

The electrolytic solution 52 is an aqueous solution containing polyatomic anions that contain oxygen (oxyanions) formed from a metal selected from groups 5B, 6B, and 7B of the periodic table of the elements. Preferably, the metal is selected from group 6B. Where the metal is capable of forming more than one oxyanion, the oxyanion containing the larger number of oxygen atoms is preferred (i.e., the "-ate" ion), and the oxyanion containing the largest number of oxygen atoms is most preferred (i.e., the "per_ate" ion). Group 5B includes vanadium, niobium, and tantalum. Group 6B includes chromium, molybdenum, and tungsten. Group 7B includes manganese, technetium, and rhenium.

In a preferred composition, the electrolytic solution 52 contains chromate, tungstate, or molybdate ions in DI water, and, for example, consists of about 1 to 200 g/l sodium dichromate. Optionally, about 5 to 100 g/l sodium sulfate or any other conductive salts can be added to increase the conductivity of the electrolyte. In a preferred embodiment, the electrolyte solution 52 consists essentially of about 5 to 75 g/l sodium dichromate.

The pH of the electrolyte solution 52 can be maintained in the range of about 0.5 to 14, preferably in the range of about 2 to 10, and most preferably in the range of about 4 to 9. The electrolyte solution 52 readily operates at all temperatures from room temperature up to about 100° C. For maximum deposition rates, it is preferred to maintain the electrolyte solution 52 temperature in the range of about 20° C. to about 80° C., and more preferably between about 40° C to about 60° C.

The electrolyte solution 52 operates well in a wide range of current densities. Successful coatings may be applied with a current density ranging from 5 amps per square foot (asf) up to about 200 asf. A more preferred current density is from about 10 asf to about 100 asf, and most preferably from about 30 asf to 70 asf. The actual current density employed is dependent on the time the foil strip 14 is exposed to the current. That is, the time the copper foil strip 14 is between the anodes 24 and immersed in electrolyte solution 52. Preferably, this dwell time is about 2 seconds or more, and more preferably between about 5 to about 25 seconds. During this dwell time, an effective thickness of a peel strength enhancement coating comprising a metal and metal oxide mixture containing a metal selected from groups 5B, 6B, and 7B of the periodic table of the elements is deposited on the copper foil. When the peel strength enhancement coating is applied to smooth copper foil, the effective thickness is that thickness capable of providing less than or equal to 10% loss of peel strength, when measured in accordance with IPC-TM-650 Method 2.4.8.5 using a ⅛ inch wide test specimen, after being immersed in 4N HCl at about 60° C. for 6 hours. IPC-TM-650 is available from The Institute for Interconnecting and Packaging Electronic Circuits, 7380 N. Lincoln Avenue, Lincolnwood, Ill. 60646, and is described in further detail below.

While the compositions of the treated surface have not been analyzed, it is believed the coating contains a mixture of metal and metal oxides with a thickness of about 20 to about 200 angstroms (Å). The morphology of the coating could also contain some micro-roughness to provide the adhesion enhancement effect.

The coated strip of copper foil 14 exits the electrolytic cell 50 and any excess electrolyte solution 52 may be rinsed from the surfaces of the copper foil 14. The rinse solution may comprise deionized water. More preferably, a small quantity of a caustic is added to the deionized water rinse solution. The concentration of caustic is quite low, under 1 percent. Preferably the caustic concentration is from about 50 to about 150 parts per million. The caustic is selected to be the hydroxide of an alkali metal or the hydroxide of an alkaline earth metal selected from the group consisting of sodium hydroxide, calcium hydroxide, potassium hydroxide and ammonium hydroxide. Most preferred is calcium hydroxide.

After rinsing, the strip of copper foil 14 may be dried by forced air. The air may be cool (e.g., at room temperature) or heated. Heated forced air is preferred since accelerated drying minimizes spotting of the copper foil 14.

After drying, the copper foil 14 may then be bonded to a dielectric substrate for forming a printed circuit board or the like using any known lamination process. The dielectric substrate may include, for example, a fiberglass reinforced epoxy such as FR-4 (a fire retardant, glass filled epoxy) or a polyimide such as Kapton manufactured by DuPont. The lamination process may include bonding the copper foil layer to the dielectric substrate through the use of heat and pressure. For example, a pressure of about 300 psi, at a temperature at about 175° C. for a time of up to 30 minutes will provide suitable adhesion between the layers.

The advantages of the present invention will become apparent from the examples that follow. The following examples are intended to illustrate, but in no way limit the scope of the present invention.

EXAMPLES

Various comparative and exemplary samples were created using copper foil laminated to an FR4 (glass filled epoxy) dielectric substrate. The copper foil, dielectric substrate, and lamination method used in each of the samples were the same. Different treatment methods were used on the copper foils for each of the samples. Each of the samples was first peel strength tested in accordance with IPC-TM-650 Method 2.4.8.5 using a ⅛ inch wide test specimen. Next, all but one of the samples were exposed to an 18% HCl solution at 25° C. for up to 48 hours and then peel strength tested again in accordance with IPC-TM-650 Method 2.4.8.5 to test the effect of hydrochloric acid (HCl), as may be used during the PCB manufacturing process for cleaning of the laminated and photodefined printed circuit board (PCB). The results of these tests are provided in Table 1, which illustrates benefits of the present invention.

In general, IPC-TM-650 Method 2.4.8.5 describes a test to determine the peel strength of a conductor at ambient temperatures. The test specifies that the test specimen is a laminated copper foil free from such defects as delamination, wrinkles, blisters, cracks, and over-etching. The laminated specimen is imaged, then etched, cleaned, and processed using standard industry practices and equipment. As applied herein, the imaged line is ⅛ inch, and sheared samples with sanded edges are used. Each sample is prepared by peeling back the strip 1 inch so that the line of peel is perpendicular to the edge of the specimen. Each specimen is then secured against a horizontal surface, with the peeled metal strip projecting upward. The end of the strip is gripped between the jaws of a testing machine clamp, with the jaws covering the full width of the metal strip and parallel to the line of peel. A suitable testing machine is that which is commercially available from Carter Engineering Co., Yorba Linda, Calif. (Model # TA 520B10CR). A force is exerted in the vertical plane (90±5°), and the metal foil is pulled at a rate of 2.0±0.1 inch-per-minute. The peel strength is determined as the average peel load in units of pounds per inch width.

Comparative sample 1 was manufactured using a copper foil having a rough, CopperBond® treated surface. Comparative sample 1 was also subjected to the P2 treatment described hereinabove, where a mixture of chromium and zinc ions or oxides was co-deposited on surfaces of the copper foil. Peel strength testing of comparative sample 1 revealed a peel strength of about 5.6 pounds per inch (lbs/inch). After 48 hours of exposure to the HCl solution, comparative sample 1 provided a peel strength of about 4.4 lbs/inch.

Comparative sample 2 was manufactured using a smooth copper foil subjected to the P2 treatment only. Peel strength testing of comparative sample 2 revealed a peel strength of about 1.6 lbs/inch. Comparative sample 2 delaminated (zero peel strength) after only 1 hour of exposure to the HCl solution.

Exemplary sample 3 was manufactured in accordance with the first aspect of the present invention. The smooth copper foil used in exemplary sample 3 was first given a P2 treatment and then dipped in a solution of 0.5% silane in DI (deionized) water at approximately 22° C. for one second or more. The sample was then rinsed in DI water and was dried prior to lamination. Peel strength testing of comparative sample 3 revealed a peel strength of about 5.5 lbs/inch. After 1 hour of exposure to the HCl solution, comparative sample 3 provided a peel strength of about 2.2 to 3.3 lbs/inch.

Comparative sample 4 was manufactured using a smooth copper foil subjected to a dip in a solution of 0.5% silane in DI (deionized) water at approximately 22° C. for one second or more. The sample was then rinsed in DI water and was dried prior to lamination. Peel strength testing of comparative sample 4 revealed a peel strength of about 1.5 lbs/inch.

Exemplary sample 5 was manufactured in accordance with the second aspect of the present invention, where a smooth copper foil was treated in a solution containing dichromate. Specifically, the solution contained 15 g/l sodium dichromate and 20 g/l sodium sulfate in DI water at cathodic 66 asf and 37° C. for 5 seconds or more. Following lamination to FR4 this treated foil had a peel strength of between 5.3 and 5.5 lbs/inch. After 48 hours of exposure to the HCl solution, comparative sample 1 provided a peel strength of about 3.0 to 3.6 lbs/inch.

TABLE 1

Effect of Surface Treatment on Peel Strength of Cu Foil

| Sample Number | Treatment Applied to Smooth Cu Surface | As-Laminated Peel Strength | Peel Strength Following HCl Exposure |
|---|---|---|---|
| 1 (comparative) | CopperBond ® treated + P2 | 5.6 lb/inch | 4.4 lb/inch (48 hr) |
| 2 (comparative) | P2 | 1.6 lb/inch | 0.0 lb/inch (1 hr) |

TABLE 1-continued

Effect of Surface Treatment on Peel Strength of Cu Foil

| Sample Number | Treatment Applied to Smooth Cu Surface | As-Laminated Peel Strength | Peel Strength Following HCl Exposure |
|---|---|---|---|
| 3 (exemplary) | P2 + Dip in 0.5% silane solution (First Aspect) | 5.5 lb/inch | 2.2-3.3 lb/inch (1 hr) |
| 4 (comparative) | Dip in 0.5% silane solution | 1.5 lb/inch | — |
| 5 (exemplary) | Electrodeposition in dichromate solution (Second Aspect) | 5.3-5.5 lb/inch | 3.0-3.6 lb/inch (48 hr) |

As can be seen in Table 1, exemplary samples 3 and 5 each provide a peel strength of about 5.5 lbs/inch, which is much greater than the peel strength provided by the surface treatments used in comparative samples 2 and 4, where only one of the P2 or the silane solution treatment was used. As also shown in Table 1, exemplary samples 3 and 5 provide a peel strength for smooth copper foil that is substantially equal to the 5.6 lbs/inch peel strength observed with a rough, Copper-Bond® treated foil. Thus, with the surface treatment methods of the present invention, smooth copper foil can have a peel strength substantially equal to that obtained using a conventional, rough-surfaced foil (e.g., a CopperBond® treated foil). This is especially advantageous when extreme fine circuit features or high frequency signal transmittance restricts the degree of surface roughness that may be used. Also, exemplary samples 3 and 5 also show the added benefit of maintaining a peel strength close to that obtained using the CopperBond® treatment, and substantially higher than that of P2 treatment alone, after exposure to HCl.

Figure 3A:
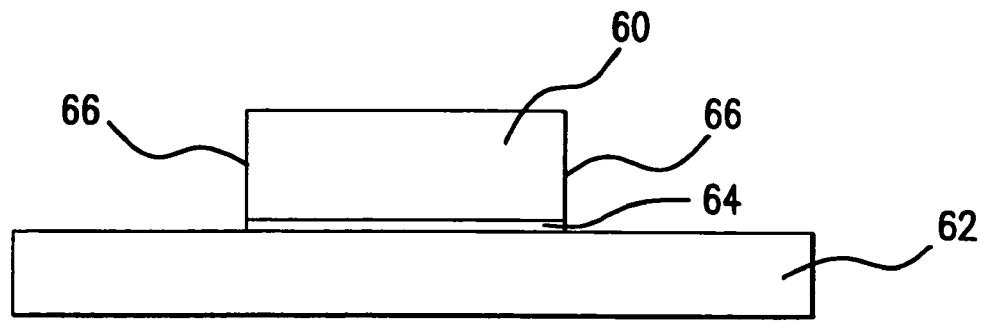
FIG. 3a is a cross-sectional view of a copper foil laminated to a dielectric substrate before exposure to hydrochloric acid (HCl)

It was determined that peel strength loss due to HCl exposure is a function of the amount of coating material lost between the copper foil and the dielectric substrate caused by the HCl exposure. Such material loss is referred to herein as "edge undercut", which can be explained by reference to FIG. 3. FIG. 3a is a cross-sectional view of a copper foil 60 laminated to a dielectric substrate 62 before exposure to HCl. Disposed between the copper foil 60 and the dielectric substrate 62 is a coating material 64, which may be a zinc or chromium-zinc (P2) anti-tarnish coating, or which may be a peel strength enhancement coating in accordance with the second aspect of the present invention. The copper foil 60 and coating material 64 form a portion of a photodefined electrical trace on the PCB. The thickness of the coating material 64 is exaggerated in FIG. 3 for purposes of explanation. Where coating material 64 is a peel strength enhancement coating, for example, the thickness of the coating material may be about 20 to about 200 Å.

Figure 3B:
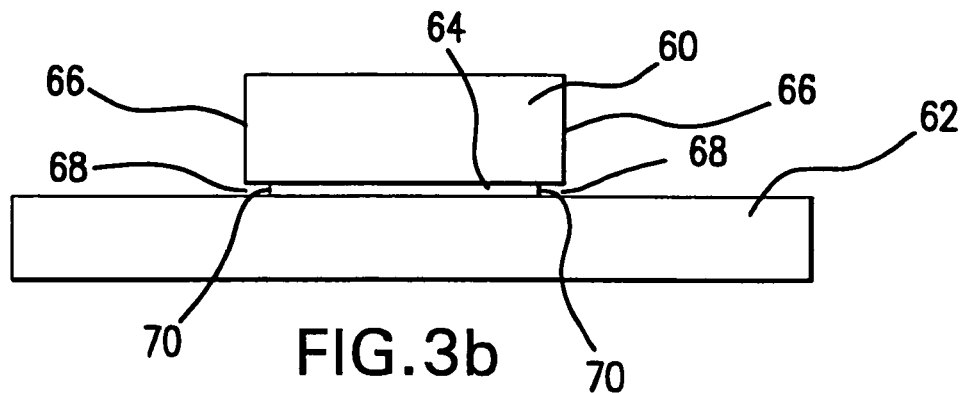
FIG. 3b is a cross-sectional view of a copper foil laminated to a dielectric substrate after exposure to HCl.
Figure 3C:
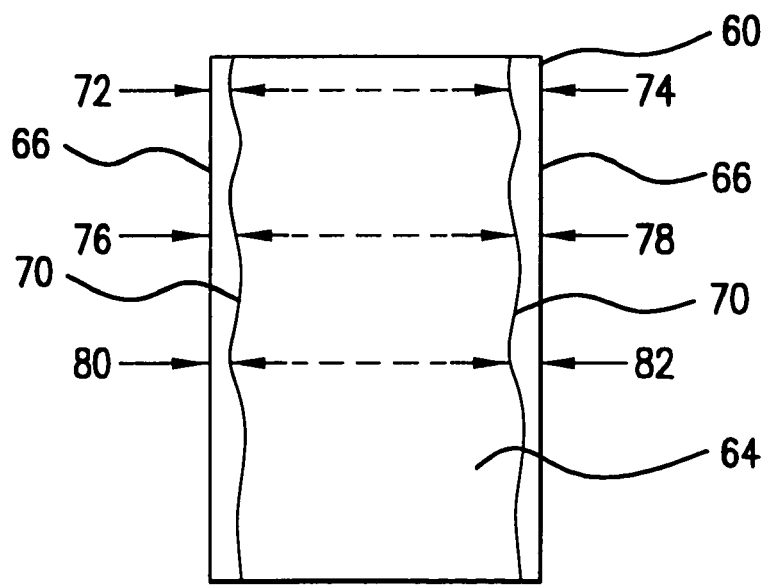
FIG. 3c is a lengthwise view of the copper foil of FIG. 3b revealing an undercut coating.

As can be seen in FIG. 3a, before exposure to HCl, the coating material 64 extends substantially to the side surfaces 66 of the foil 60. Exposure to HCl, which would be used for cleaning the PCB, causes a portion 68 of the coating material 64 proximate the edge surfaces 66 to be removed (i.e., undercut), as shown in FIG. 3b. FIG. 3c is a lengthwise view of the strip of foil 60 revealing the undercut coating material 64. As can be seen in FIG. 3c, undercutting of the coating material 64 results in a non-linear edge 70 of the coating material 64.

Figure 4:
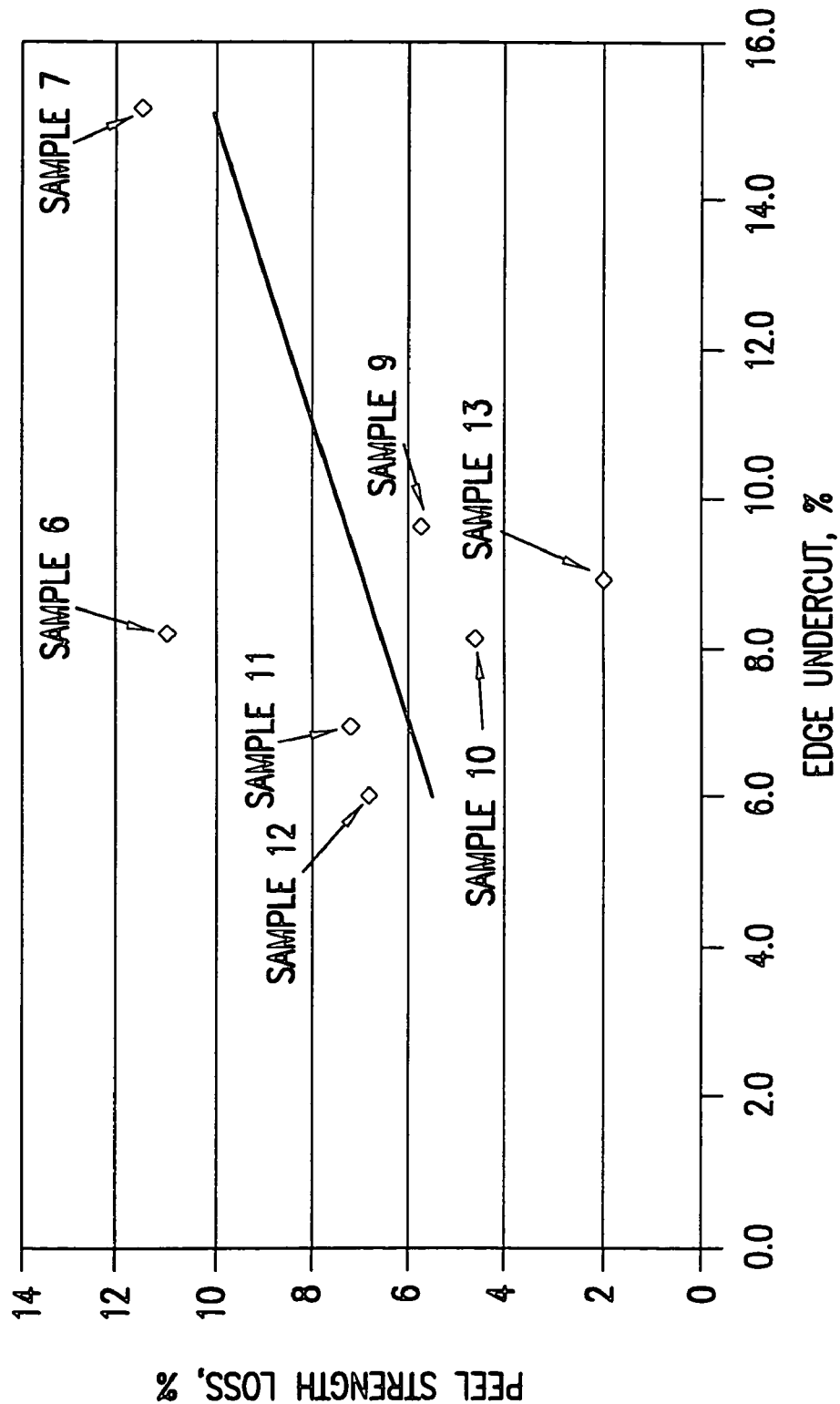
FIG. 4 is a graph depicting percent peel strength loss as a function of percent undercut.

FIG. 4 is a curve-fit representation of data gathered from the testing of various comparative and exemplary samples created using copper foil laminated to an FR4 (glass filled epoxy) dielectric substrate and depicts peel strength loss (%) as a function of percent undercut. As can be seen from FIG. 4, percent peel strength loss can be represented as a linear function of edge undercut. Thus, the more edge undercut experienced by the sample due to exposure to HCl, the greater the peel strength loss. With regard to the second aspect of the present invention (surface treatment 2), testing has shown that this treatment results in a reduction in both the percent edge undercut and the percent peel strength loss due to HCl exposure, when compared to prior art anti-tarnish coatings. This testing is described below.

Table 2 includes the data used to generate the graph of FIG. 4. The data of Table 2 were generated using a test method in which various comparative and exemplary laminate samples were created using smooth copper foils subjected to different surface treatments. Comparative samples 7-9 represent known surface treatments, while exemplary samples 9-14 represent surface treatments in accordance with the second aspect of the present invention (surface treatment 2). The copper foil, dielectric substrate, and lamination method used in each of the samples of Table 2 were the same, and the samples differed only by the surface treatment used.

For each sample in Table 2, the treated copper foil was laminated to an FR4 dielectric substrate (FR4 PCL 370 having a glass transition temperature (Tg) of 175° C.). The lamination cycle consisted of 50 minutes heating with a maximum temperature of 182° C. and a pressure of 300 psi followed by a 15 minute cooling cycle. The exposed surface of the copper foil was etched in a solution of ammonium persulfate (120 g/l ammonium persulfate plus 3% by volume of concentrated sulfuring acid (about 18 molar) in one liter of DI water) at 44° C. for 45 seconds. The sample was then rinsed and dried. Next, the copper foil was plated up to a thickness from about 0.0012 to 0.0016 inches using an acid copper bath without brighteners (60 g/l Cu and 65 g/l sulfuric acid in DI water at 50° C.). The desired thickness was obtained in 24 minutes using a current density of about 0.065 amps/cm$^2$. Using a guillotine paper cutter, ¼ inch wide by 6 inch long test specimens were prepared from each sample, and each specimen was then sheared to ⅛ inch wide using a double edge precision shear. The edges of the specimens were lightly polished using a 600 grit paper to remove any damage that might be introduced by shearing.

At least four specimens were prepared for each sample. Half of the specimens (the control specimens) were peel strength tested in accordance with IPC-TM-650 Method 2.4.8.5 without being subjected to HCl. The "As-Laminated" peel strength for the sample is the average peel load for the control specimens in units of pounds per inch width. The remaining specimens were immersed in 4N HCl at 60° C. for 6 hours, followed by rinsing and drying. The exposed specimens were then peel strength tested in accordance with IPC-TM-650 Method 2.4.8.5. In Table 2, the "Peel Strength After 6 Hr HCl Exposure" is the average peel load for the exposed specimens in units of pounds per inch width. Also shown in Table 2 is the percent peel strength loss for each sample, which is equal to the peel strength after 6 hours of HCl exposure expressed as a percentage of the as-laminated peel strength.

The percent edge undercut for each sample was determined as follows. First, each exposed specimen was viewed under 100× magnification and the distance between the edge of the coating material to the edge of foil was measured on both sides of the exposed specimen at three different locations. Referring to FIG. 3, for example, these measurements are shown at 72, 74, 76, 78, 80, and 84, with three different measurements being made at each side 66 of the specimen. After the measurements were made, the average measurement for each side was calculated. The percent undercut for the specimen was then calculated as the sum of the average measurement for both sides expressed as a percentage of the total width of the specimen (⅛ inch). The percent edge undercut for the sample was then calculated by averaging the percent undercut for each specimen associated with the sample. The percent edge undercut for each sample is provided in Table 2.

14 was deposited using an aqueous solution containing 31 g/l tungsten at pH 4, 140° F., while applying 40 asf for 5 seconds.

As can be seen in Table 2, each comparative and exemplary provided an acceptable peel strength before exposure to HCl of about 4 lb/in. However, after exposure to HCl, the comparative samples showed a greater percent peel strength loss than did the exemplary samples. The comparative samples provided a percent peel strength loss in the range of 11.2 to 19.8 percent. The exemplary samples, on the other hand, were shown to be effective in providing a percent peel strength loss of less than or equal to 10 percent after being exposed to 4N HCl at 60° C. for 6 hours. Indeed, the exemplary samples were effective in providing a percent peel strength loss of less than or equal to about 7 percent. The exemplary samples also showed an improved resistance to edge undercut when compared to smooth foils having a P2 or Zn—Ni coating. It is believed that exposing the copper foil to silane prior to lamination, as in the first aspect of the present invention, would further enhance peel strength of copper foil treated in accordance with the second aspect of the present invention.

TABLE 2

Effect of Surface Treatment on Peel Strength of Cu Foil

| Sample Number | Treatment Applied to Smooth 5 μm Cu Foil | As-Laminated Peel Strength (lb/in) | Peel Strength After 6 Hr HCl Exposure (lb/in) | % Peel Strength Loss | % Edge Undercut |
|---|---|---|---|---|---|
| 6 (comparative) | Commercial Surface Treatment | 4.56 | 4.05 | 11.2 | 8.2 |
| 7 (comparative) | P2 | 4.51 | 3.99 | 11.5 | 15.1 |
| 8 (comparative) | Zn—Ni | 4.14 | 3.32 | 19.8 | 22.0 |
| 9 (exemplary) | Chromate w/Si | 4.32 | 4.07 | 5.8 | 9.6 |
| 10 (exemplary) | Chromate | 4.52 | 4.31 | 4.7 | 8.1 |
| 11 (exemplary) | Thick Chromate (20 s) | 4.22 | 3.92 | 7.1 | 6.9 |
| 12 (exemplary) | Acidic Chromate | 3.88 | 3.62 | 6.7 | 6.0 |
| 13 (exemplary) | CDC | 4.64 | 4.55 | 1.9 | 8.9 |
| 14 (exemplary) | Tungstate | 4.29 | 4.32 | −0.7 | 7.2 |

Each of the samples in Table 2 was prepared using smooth 5 μm copper foil. Comparative samples 6 and 7 were prepared using commercially available copper foils, with sample 7 being a P2 treated foil commercially available as XTF from Olin Corporation of Norwalk, Conn. Each of the comparative and exemplary samples 8-14 were prepared using bare, smooth copper foil having various surface treatments. The Zn—Ni coating of comparative sample 8 was deposited using an aqueous solution containing 10 g/l Ni as sulfate, 3 g/l Zn as sulfate, and 20 g/l citric acid at pH 4, 130° F., while applying 10 asf for 3 seconds and 50 asf for 3 seconds. The chromate with silicate coating of exemplary sample 9 was deposited using an aqueous solution containing 5 g/l $Na_2Cr_2O_7 \cdot 2H_2O$ (1.75 g/l Cr), 10 g/l NaOH, and 10 g/l Na silicate at 140° F., while applying 20 asf for 10 seconds. The chromate coating of exemplary sample 10 was deposited using an aqueous solution containing 5 g/l $Na_2Cr_2O_7 \cdot 2H_2O$ (1.75 g/l Cr), and 10 g/l NaOH, at 140° F., while applying 20 asf for 10 seconds. The thick chromate of exemplary sample 11 was deposited using the same aqueous solution as that of comparative sample 10, with an increased dwell time of 20 seconds. The acidic chromate of exemplary sample 12 was deposited using an aqueous solution containing 15 g/l $Na_2Cr_2O_7 \cdot 2H_2O$, and 20 g/l sodium sulfate at 104° F., while applying 66 asf for 10 seconds. The cathodic dichromate (CDC) of exemplary sample 13 was deposited using an aqueous solution containing 8.75 g/l Cr (25 g/l $Na_2Cr_2O_7 \cdot 2H_2O$) at pH 4, 140° F., while applying 40 asf for 5 seconds. The tungstate of exemplary sample The surface treatment methods of the present invention allow the use of smooth copper foil laminates while providing a peel strength substantially equal to that obtained using conventional, rough-surfaced foils. This is especially advantageous when extreme fine circuit features or high frequency signal transmittance restricts the degree of surface roughness that may be used. Also, the surface treatment methods of the present invention provide the added benefit of maintaining a peel strength close to that obtained using rough-surfaced foils, and substantially higher than that of other smooth copper foil treatments, after exposure to HCl. While the invention is particularly useful for use with a smooth copper foil, the invention could be applied to copper foils having any surface finish.

One or more aspects and embodiments of the present invention have been described. Nevertheless, it will be understood that various modifications may be made without departing from the spirit and scope of the invention. Accordingly, other aspects and embodiments are within the scope of the following claims.

What is claimed is:

1. A smooth surface copper foil for lamination to a dielectric substrate, the copper foil comprising:
   a peel strength enhancement coating deposited on a smooth surface of the copper foil having an $R_z$ of less than about 1 μm to be laminated to said dielectric substrate, the peel strength enhancement coating consisting essentially of a metal and metal oxide mixture, the metal and metal oxide mixture being formed from one or more of: vanadium, niobium, tantalum, chromium, molybdenum, tungsten, manganese, technetium, and rhenium.

2. The copper foil of claim 1, wherein the metal oxide is selected from the group consisting of chromate, tungstate and molybdate.

3. The copper foil of claim 1, wherein the peel strength enhancement coating has a thickness of between about 20 to about 200 angstroms.

4. The copper foil of claim 1, wherein silane is deposited on the peel strength enhancement coating prior to lamination to the dielectric substrate.

5. An article comprising:

a dielectric substrate;

a copper foil having a smooth surface with an $R_z$ less than about 1 μm laminated to the dielectric substrate; and a peel strength enhancement coating disposed between the smooth surface of the copper foil and the dielectric substrate, said peel strength enhancement coating being a mixture of a metal and a metal oxide with said metal selected from the group consisting of one or more of vanadium, niobium, tantalum, chromium, molybdenum, tungsten, manganese, technetium, and rhenium, wherein the copper foil exhibits less than or equal to 10% loss of peel strength when measured in accordance with IPC-TM-650 Method 2.4.8.5 using a ⅛ inch test specimen after being immersed in 4N HCl at 60° C. for 6 hours.

6. The article of claim 5, wherein the metal oxide is selected from the group consisting of chromate, tungstate and molybdate.

7. The article of claim 5, wherein the peel strength enhancement coating has a thickness of between about 20 to about 200 angstroms.

8. The article of claim 4, wherein the peel strength enhancement coating exhibits less than or equal to 10% edge undercut after the immersion in 4N HCl at 60° C. for 6 hours.

9. The article of claim 5, wherein the copper foil exhibits less than or equal to about 7% loss of peel strength when measured in accordance with IPC-TM-650 method 2.4.8.5 using a ⅛ inch test specimen after being immersed in 4N HCl at 60° C. for 6 hours.

10. The article of claim 5, wherein silane is deposited on the peel strength enhancement coating prior to lamination to the dielectric substrate.

* * * * *